(12) United States Patent
Ting et al.

(10) Patent No.: US 7,351,108 B2
(45) Date of Patent: Apr. 1, 2008

(54) CARD CONNECTOR

(75) Inventors: Chien-Jen Ting, Tu-Cheng (TW); Yung-Chang Cheng, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/414,793

(22) Filed: May 1, 2006

(65) Prior Publication Data

US 2006/0246757 A1 Nov. 2, 2006

(30) Foreign Application Priority Data

Apr. 29, 2005 (TW) .............................. 94206869 U

(51) Int. Cl.
*H01R 24/00* (2006.01)
(52) U.S. Cl. ........................................ 439/630; 439/64
(58) Field of Classification Search ................ 439/630, 439/64, 159
See application file for complete search history.

(56) References Cited

U.S. PATENT DOCUMENTS

| | | | | |
|---|---|---|---|---|
| 5,879,175 A | * | 3/1999 | Muramatsu et al. | 439/159 |
| 6,315,583 B1 | * | 11/2001 | Nishioka | 439/131 |
| 6,508,402 B1 | * | 1/2003 | Takada et al. | 235/451 |
| 6,629,860 B1 | * | 10/2003 | Hu et al. | 439/607 |
| 6,786,410 B2 | * | 9/2004 | Kihara | 235/453 |
| 6,988,904 B1 | * | 1/2006 | Lai | 439/159 |
| 2005/0106944 A1 | | 5/2005 | Kuo | |

* cited by examiner

*Primary Examiner*—Tulsidas C. Patel
*Assistant Examiner*—Vladimir Imas
(74) *Attorney, Agent, or Firm*—Wei Te Chung

(57) ABSTRACT

A card connector comprises an insulating housing having a base; a plurality of contacts received in the base of the insulating housing; a shell covering the insulating housing to define a card receiving space and a card insertion direction. The insulating housing is formed with a guide rail and a mating portion, the guide rail and the mating portion extend into the card receiving space from the base of the insulating housing. The contacts comprise a plurality of contacting portions received in the mating portion.

20 Claims, 6 Drawing Sheets

CARD CONNECTOR

BACKGROUND OF THE INVENTION

1. Field of the Invention

The present invention is generally related to card connectors, and more particularly, to a card connector which has a guide rail for guiding insertion of a card.

2. Description of Related Art

With the development of electronic appliances, different electrical cards are used to expand additional functions of the electronic appliance, such as data storage. A card connector is required to receive the electrical card to achieve the storage or transmission of signal between the electrical card and the corresponding electronic appliance. For adapting to requirements to a card, an express card, which has quicker speed than a conventional card at data transmission are achieved. Thus, corresponding express card connector arises. The express card has two types in configuration, one is rectangular and another is L-shaped.

US Application Publication No. 20050106944 discloses an express card connector, which comprises an insulating housing, a plurality of contacts received in the insulating housing, a shell covering the insulating housing and a guide member. The insulating housing has a base portion and a pair of arms extending from opposite ends of the base portion. The guide member detachably connects with one of the two arms. Because the guide member is detachable from the insulating housing, it needs an independent die to mold the guide member so that it is certain to increase producing cost and manufacturing procedure for manufacturing the card connector.

Hence, an improved card connector is required to overcome the disadvantages of the related art.

SUMMARY OF THE INVENTION

Accordingly, an object of the present invention is to provide a card connector which has a guide member unitary with an insulating housing thereof.

To achieve the above objects, a card connector comprises an insulating housing having a base; a plurality of contacts received in the base of the insulating housing; a shell covering the insulating housing to define a card receiving space and a card insertion direction. The insulating housing is formed with a guide rail and a mating portion, the guide rail and the mating portion extend into the card receiving space from the base of the insulating housing. The contacts comprise a plurality of contacting portions received in the mating portion.

Other objects, advantages and novel features of the present invention will be drawn from the following detailed description of a preferred embodiment of the present invention with attached drawings.

DETAILED DESCRIPTION OF THE INVENTION

Figure 1:
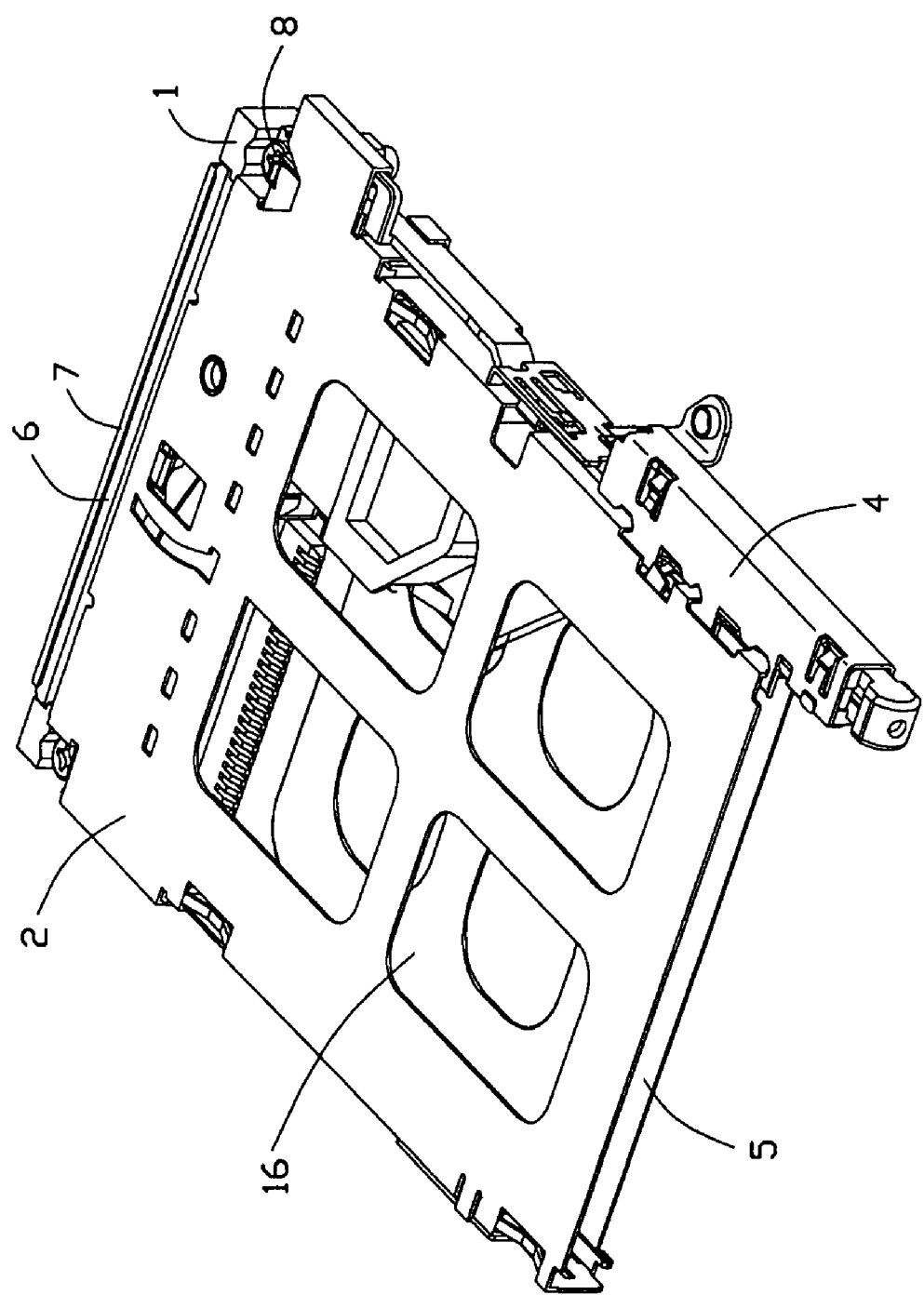
FIG. 1 is an assembled, perspective view of the card connector in accordance with the present invention.
Figure 2:
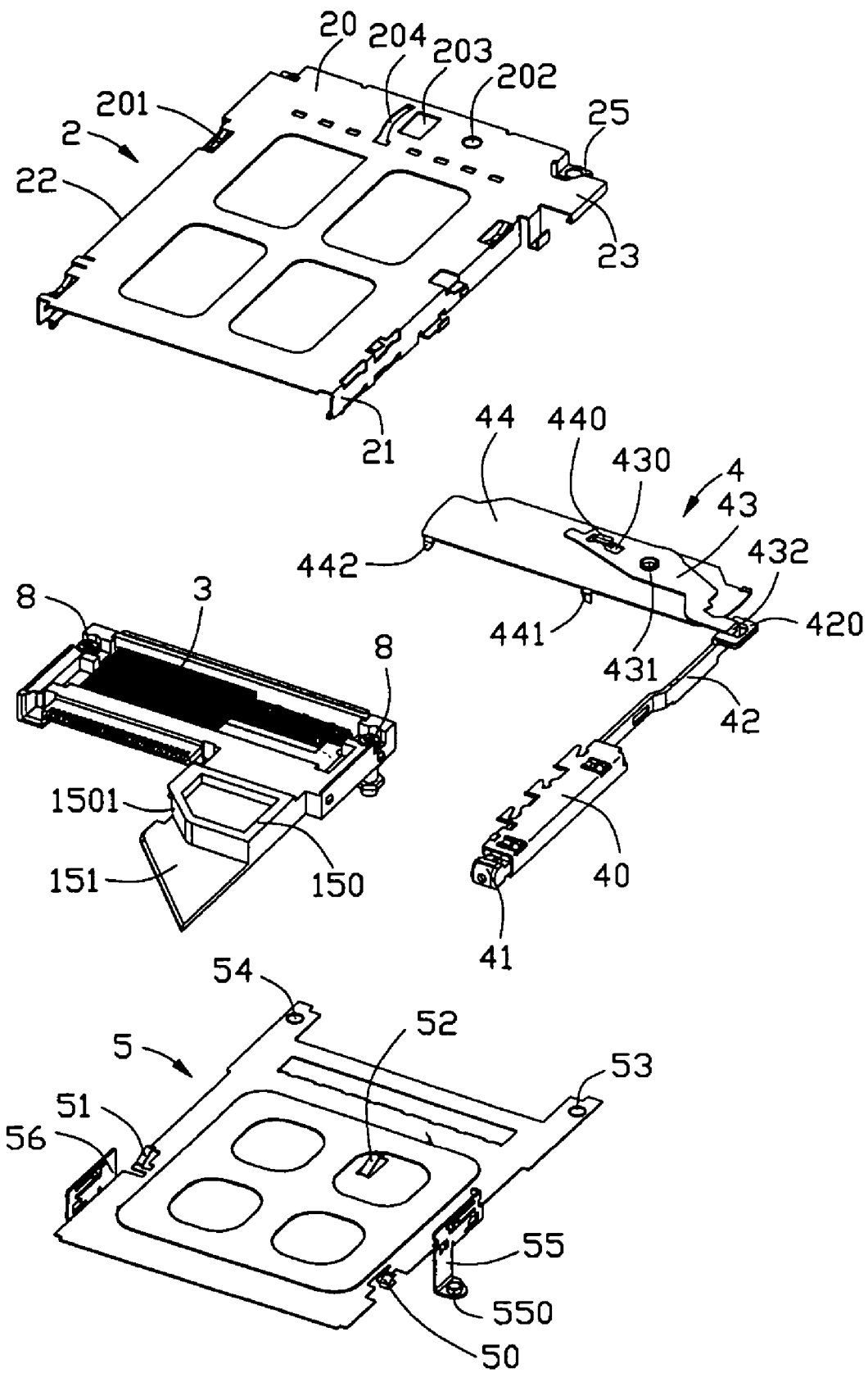
FIG. 2 is an exploded, perspective of the card connector of FIG. 1.
Figure 3:
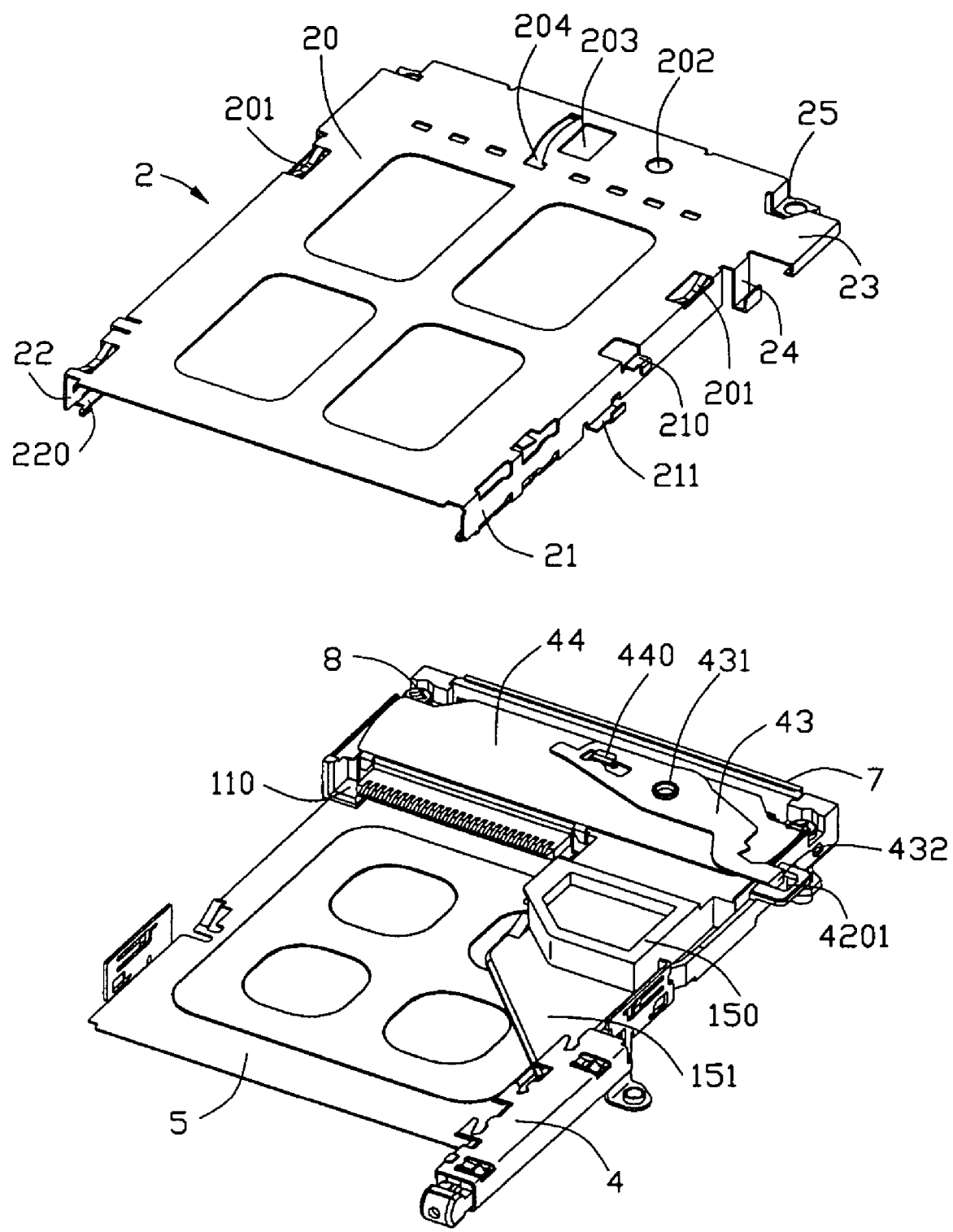
FIG. 3 is a partially exploded, perspective view of the card connector of FIG. 2 with a shell not assembled to an insulating housing.

Reference will now be made in detail to the preferred embodiment of the present invention.

Referring to FIGS. 1-6, the card connector in accordance with the present invention is adapted for receiving a rectangular or a L-shaped card. The card connector comprises an insulating housing 1, a plurality of contacts 3 received in the insulating housing 1, an ejector 4, a shell having an upper shell 2 and a bottom shell 5, a positioning member 6 and a daughter board 7.

Figure 4:
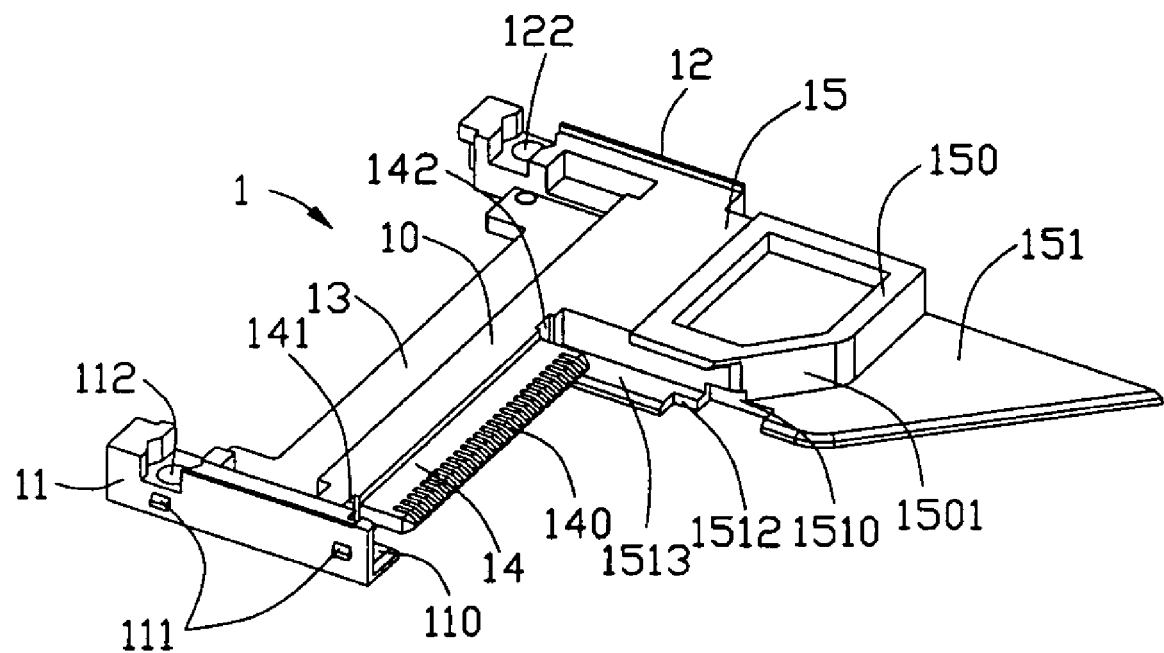
FIG. 4 is a perspective view of the insulating housing of the card connector of FIG. 1.
Figure 5:
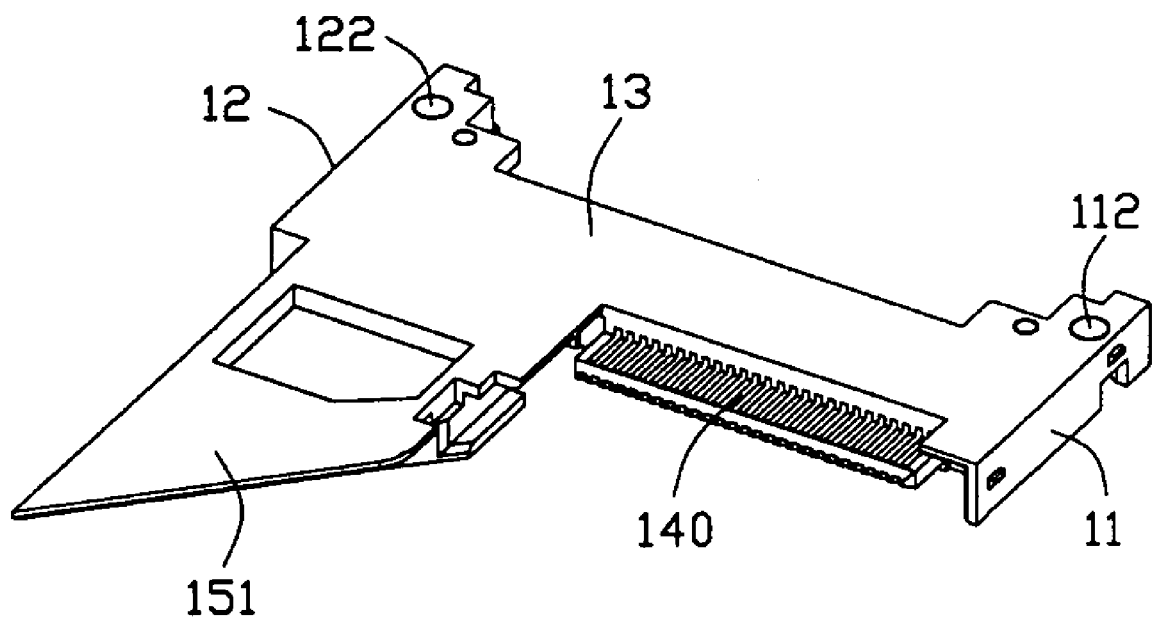
FIG. 5 is a perspective view similar to FIG. 4, but taken from another aspect.
Figure 6:
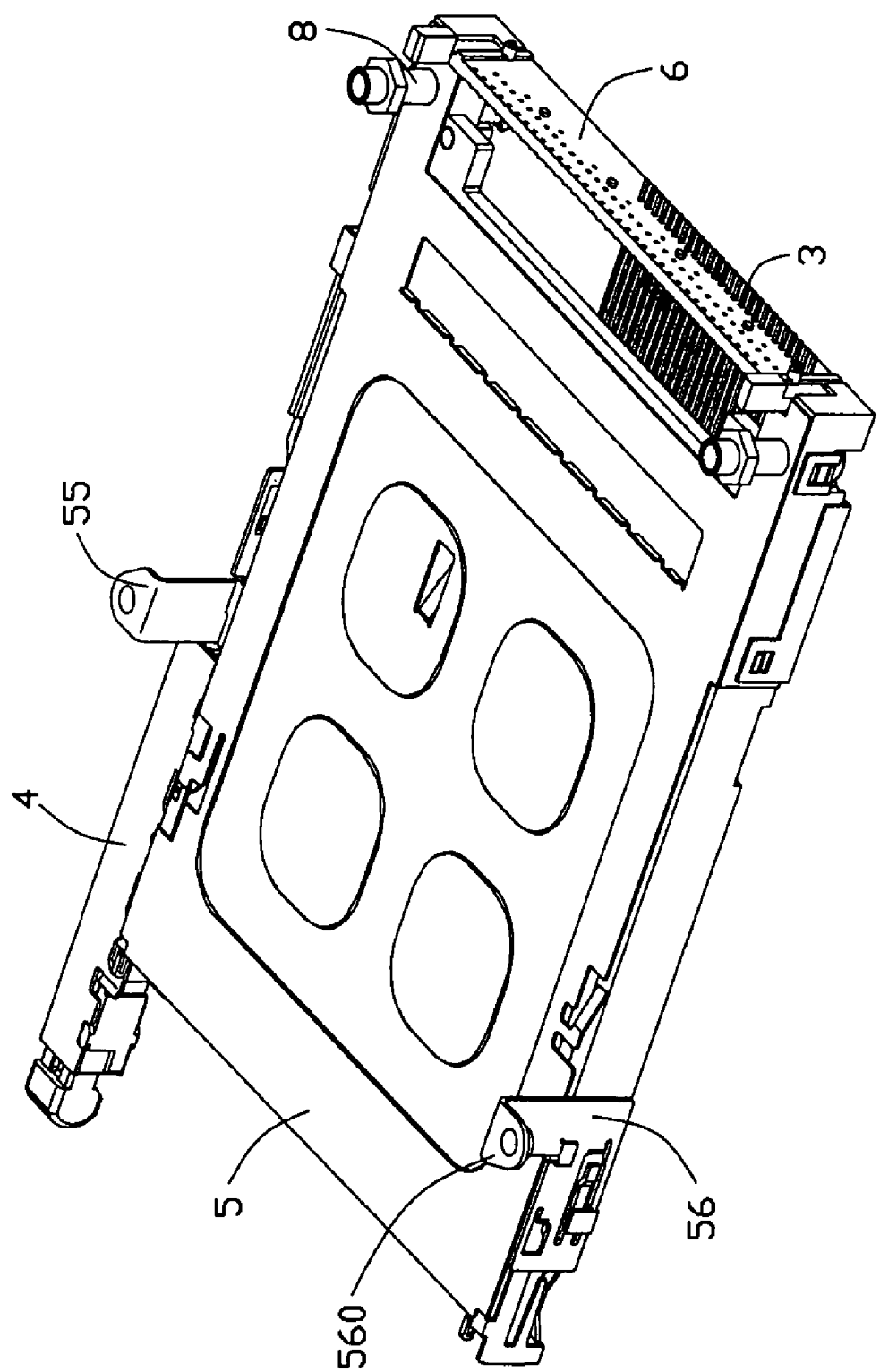
FIG. 6 is a perspective view similar to FIG. 1, but taken from another aspect.

The shell covers the insulating housing 1 to define a card receiving space 16 there between and define a card insertion direction. Referring to FIG. 4, the insulating housing 1 comprises an elongated base 10, a pair of arms 11, 12 extending forwardly and rearward from opposite ends of the base 10, a holding plate 13 extending forwardly from a lower portion of the base 10 and locating between the pair of arms 11, 12, a mating portion 14 and a guide rail 15. The mating portion 14 and the guide rail 15 extend into the card receiving space 16 from the base 10. The guide rail 15 spaces from the arm 12 and is arranged side by side with the mating portion 14 so that the mating portion 14 locates between the arm 11 and the guide rail 15 along a transverse direction perpendicular to the card insertion direction.

The arms 11, 12 have a pair of wedges 111 on outer faces thereof and defines nut holes 112, 122 respectively on front ends thereof. The arm 11 has a first guiding slot 110 for guiding insertion of a card. The insulating housing 1 defines a pair of recesses 141, 142 locating besides opposite sides of the mating portion 14 and communicating with the card receiving space 16. The guide rail 15 is approximately a trapezoid configuration and has a guide block 150 extending rearward from the base 10 and a triangle guide plate 151 extend rearward from a lower portion of the guide block 150. The guide block 150 defines a second guiding slot 1513 opposite to the first guiding slot 110 and has a slope 1501 at a rear end of the guiding slot 1513. The guide plate 151 defines a cutout 1510 at the connection of the guide plate 151 and the guiding slot 1513 and the guiding slot 1513 has a protrusion 1512 at a lower side thereof to protrude towards the mating portion 14.

Referring to FIGS. 2-6, the positioning member 6 and the daughter board 7 are assembled to the front end of the housing 1 and locate between the pair of arms 11, 12. Each of the contacts 3 comprises a contacting portion (not labeled) received in a channel 140 of the mating portion 14 and a tail portion (not labeled) extending forwardly from the contacting portion. The tail portions of the contacts 3 pass through the positioning member 6 so as to be electrically received in the daughter board 7.

The upper shell 2 is stamped from a metal sheet. The upper shell 2 has a main body 20 and a pair of sidewalls 21, 22 extending downwardly from two lateral sides of the main body 20. Two horizontal slices 220 extend from free ends of the sidewalls 21, 22 towards the card receiving space 16. Each of the sidewalls 21, 22 is formed with a lower clasp 211 and an upper clasp 210 arranged along the card insertion direction and extending outwardly from an upper side and a lower side thereof. The main body 20 has a plurality of concave members 201 adjacent to the sidewalls 21, 22, an U-shaped holding plate 24 extending downwardly from lateral side thereof and shield portion 23 extending horizontally beyond the main body 20. Two locking portion 25 are formed at opposite ends of a front end of the main body 20. The sidewall 21, the holding plate 24, the shield portion 23 and one locking portion 25 are arranged in turn along the card insertion direction. A circular hole 202, a rectangular hole 203 and an arc slot 204 are formed on a middle portion of the front end of the main body 20.

The bottom shell 5 is assembled to the upper shell 5. The bottom shell 5 is a metal sheet and has a first resilient member 50, a second resilient member 51 and a third resilient member 52 protruding upwardly together. The first and second resilient member 50, 51 are disposed at opposite sides of a rear end of the bottom shell 5. The third resilient member 52 is disposed at approximately middle portion of the bottom shell. A pair of through holes 53, 54 are formed at opposite ends of a front end of the bottom shell 5. When assembled, the upper shell 2 and lower shell 5 are assembled to the insulating housing 1 in virtue of a nut 8 securing the holes of the locking portions 25, the nut holes 112, 122 and the through hole 53, 54 together. The third resilient member 52 is exposed into the cutout 1510 of the housing 1.

The ejector 4 comprises a push rod 40 assembled to the shell, a sliding member 42, a pivoting member 43 and an eject member 44. The pivoting member 43 and the eject member 44 locate between an upper face of the insulating housing 1 and the upper shell 2. The pivoting member 43 has a pivoting portion 431 pivotally received in the circular hole 202 of the shell 2, a polygon cutout 430 with a securing piece 440 of the eject member 44 moveably received in. The polygon cutout 430 and the securing piece 440 are exposed in the rectangular hole 203 of the shell 2. One end of the pivoting member 43 is disposed in the arc slot 204 moveably and the other end connects with a front end 420 of the sliding member 42. A rear end of the sliding member 42 is received in the push rod 40 with a push button 41. The eject member 44 has a pair of ejecting portion 441, 442 received in the recesses 141, 142 respectively to eject a card when ejecting the card.

The card connector has a pair of stand offs 55, 56 with mounting portions 550, 560 thereon. The stand offs 55, 56 mate with the upper and lower clasps 210, 211 so as to make the stand offs 55, 56 be assembled to the shell.

When a rectangular card is not inserted along the guiding slot 1513, the protrusion 1512 will collide with a front end of the card to prevent the card from contacting with the contacts 3.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. A card connector comprising:
   an insulating housing comprising a base;
   a plurality of contacts received in the base of the insulating housing;
   a shell covering the insulating housing to define a card receiving space and a card insertion direction; and
   the insulating housing formed with a guide rail and a mating portion, both the guide rail and the mating portion unitarily molded with the base of the insulating housing and being immoveable with regard to the base, and extending into the card receiving space from the base, the contacts comprising a plurality of contacting portions receiving in the mating portion; wherein
   the guide rail defines a guide plate which is triangular in a top view to form a slope relative to both said card insertion direction and a transverse direction which is perpendicular to said card insertion direction so as to guide card insertion along both the card insertion direction and said transverse direction.

2. The card connector as claimed in claim 1, wherein the insulating housing has a pair of arms formed at lateral sides of the base.

3. The card connector as claimed in claim 2, wherein the guide rail locates between the mating portion and one of the pair of arms along said transverse direction perpendicular to the card insertion direction.

4. The card connector as claimed in claim 1, wherein the guide rail comprises a guide block extending from the base and said guide plate extending from a lower portion of the guide block, and the guiding slot is defined in the guide block.

5. The card connector as claimed in claim 4, wherein the shell comprises an upper shell and a bottom shell assembled to the upper shell, wherein the bottom shell has a resilient member to be exposed in a cutout of the housing adjacent to the guiding slot of the guide block.

6. The card connector as claimed in claim 1, wherein the shell is approximately a rectangular configuration in the top view without cutout at a corner.

7. A card connector comprising;
   a one-piece insulating housing;
   a plurality of contacts received in the base of the insulating housing;
   a shell covering the insulating housing to define a card receiving space and a card insertion direction perpendicular to said transverse direction; and
   the insulating housing formed with a guide rail and a mating portion, both the guide rail and the mating portion unitarily molded with the insulating housing without any relative movement thereto and being juxtaposed with each other from an elevantional view, the contacts comprising a plurality of contacting portions received in the mating portion; wherein
   the mating portion is dimensioned with about three fifths of a full dimension of the housing along said transverse direction under a condition that the full dimension of the housing is essentially same as a full dimension of said card receiving space along said transverse direction.

8. The card connector as claimed in claim 7, wherein the shell comprises an upper shell which has a main body and a pair of sidewalls extending downwardly from two lateral sides of the main body, so as to form a quadrilateral receiving space.

9. The card connector as claimed in claim 8, wherein the shell also comprises a bottom shell, which is assembled to the upper shell and has a resilient member to be exposed in a cutout of the housing adjacent to the guiding slot of the guide block.

10. The card connector as claimed in claim 7, wherein the guide rail includes a rear guide block and a front triangle guide plate, said guide plate being lower than the guide block.

11. The card connector as claimed in claim 10, wherein the mating portion is located behind the guide block and the guide plate in said card insertion direction.

12. The card connector as claimed in claim 7, wherein the guide rail provides only one side guidance for an insertion card, and the shell provides another one for the other side guidance.

13. The card connector as claimed in claim 7, wherein said guide rail is essentially offset form the mating portion along said transverse direction, under a condition that a dimension of said guide rail along said transverse direction is about two thirds of that of the mating portion along said transverse direction.

14. The card connector as claimed in claim 7, wherein the housing defines an elongated base along said transverse direction with the full dimension of the housing along said transverse direction, on which the mating portion is formed.

15. The card connector as claimed in claim 7, further including an ejector having a sliding member located on one side of the housing, and a pivoting member which is connected to the sliding member and is located behind the mating portion.

16. The card connector as claimed in claim 7, wherein a combination of the shell and the housing is approximately a rectangular configuration in at a top view without any cutout at a corner.

17. An electrical connector for use with at least one inserted electronic card, comprising:
   an insulative housing comprising a base;
   a plurality of contacts received in the base of the insulating housing;
   a shell covering the insulating housing to define a card receiving space and a card insertion direction; and
   the insulating housing fanned with a guide rail and a mating portion, the guide rail and the mating portion being immoveable with regard to the base of the insulating housing and extending into the card receiving space from the base, the contacts comprising a plurality of contacting portions received in the mating portion; wherein
   the housing defines a guide slot along the card insertion direction for holding an inserted card, and a cutout vertically in communication with the guide slot, and the shell defines a resilient member inwardly extending through said cutout and invades the guide slot for engagement with the inserted card.

18. The card connector as claimed in claim 17, wherein said guide rail defines a guide plate which is triangular in a top view to form a slope relative to both said card insertion direction and a transverse direction which is perpendicular to said card insertion direction so as to guide card insertion along both said card insertion direction and said transverse direction.

19. The card connector as claimed in claim 18, wherein said resilient member is located at a rear side of said guide plate, and the guide rail is unitarily formed with the housing.

20. The card connector as claimed in claim 17, wherein said resilient member extends upwardly into the guide slot.

* * * * *